(12) United States Patent
Zhu et al.

(10) Patent No.: US 8,610,275 B2
(45) Date of Patent: Dec. 17, 2013

(54) SEMICONDUCTOR CONTACT STRUCTURE INCLUDING A SPACER FORMED WITHIN A VIA AND METHOD OF MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 258 days.

(21) Appl. No.: 12/996,721

(22) PCT Filed: Sep. 27, 2010

(86) PCT No.: PCT/CN2010/001498
§ 371 (c)(1),
(2), (4) Date: Dec. 7, 2010

(87) PCT Pub. No.: WO2012/006766
PCT Pub. Date: Jan. 19, 2012

(65) Prior Publication Data
US 2012/0013009 A1    Jan. 19, 2012

(51) Int. Cl.
*H01L 23/522* (2006.01)
*H01L 21/441* (2006.01)

(52) U.S. Cl.
USPC .... 257/751; 257/774; 257/775; 257/E23.145; 438/638; 438/639; 438/643

(58) Field of Classification Search
USPC .................................................. 257/E23.157
See application file for complete search history.

(56) References Cited

U.S. PATENT DOCUMENTS

| | | | |
|---|---|---|---|
| 4,641,420 A * | 2/1987 | Lee | 428/621 |
| 7,217,654 B2 * | 5/2007 | Nagahara et al. | 438/637 |
| 2002/0079586 A1 * | 6/2002 | Uchiyama et al. | 257/758 |
| 2005/0017365 A1 * | 1/2005 | RamachandraRao et al. | 257/758 |
| 2006/0163735 A1 * | 7/2006 | Tseng | 257/758 |
| 2007/0010085 A1 * | 1/2007 | Tsai et al. | 438/622 |
| 2008/0157379 A1 | 7/2008 | Choi | |

FOREIGN PATENT DOCUMENTS

| | | |
|---|---|---|
| CN | 101211824 A | 7/2008 |
| JP | 8153795 A | 6/1996 |

OTHER PUBLICATIONS

First Office Action of the Chinese Patent Office in application No. 2010102320608 dated Sep. 24, 2012.
Second Office Action of the Chinese State Intellectual Property Office in application No. 2010102320608 dated Mar. 6, 2013.

* cited by examiner

*Primary Examiner* — Stephen W Smoot
(74) *Attorney, Agent, or Firm* — Kinney & Lange, P.A.

(57) ABSTRACT

The present invention discloses a semiconductor structure and a method for manufacturing the same. The semiconductor structure comprises a semiconductor substrate, a local interconnect structure connected to the semiconductor substrate, and at least one via stack structure electrically connected to the local interconnect structure, wherein the at least one via stack structure comprises a via having an upper via and a lower via, the width of the upper via being greater than that of the lower via; a via spacer formed closely adjacent to the inner walls of the lower via; an insulation layer covering the surfaces of the via and the via spacer; a conductive plug formed within the space surrounded by the insulation layer, and electrically connected to the local interconnect structure. The present invention is applicable to manufacture of a via stack in the filed of manufacturing semiconductor.

17 Claims, 9 Drawing Sheets

SEMICONDUCTOR CONTACT STRUCTURE INCLUDING A SPACER FORMED WITHIN A VIA AND METHOD OF MANUFACTURING THE SAME

BACKGROUND OF THE INVENTION

1. Field of Invention

The present invention relates to a field of semiconductor, and particularly, to a semiconductor structure and a method of manufacturing the same. More particularly, the present invention relates to a method of manufacturing a self-aligned via stack with variable via sizes and a semiconductor structure having a self-aligned via stack with variable via sizes manufactured by said method.

2. Description of Prior Art

Metal lines above vias in IC interconnects lead to serious problems of via-to-via or via-to-line shorts as the spacing between the semiconductor devices is aggressively scaled down. Therefore, requirements for the alignment between vias and metal lines in the photolithography become stricter, resulting in higher costs for massive production. Another method is to make smaller vias, which brings higher requirements for photolithography.

Figure 1:
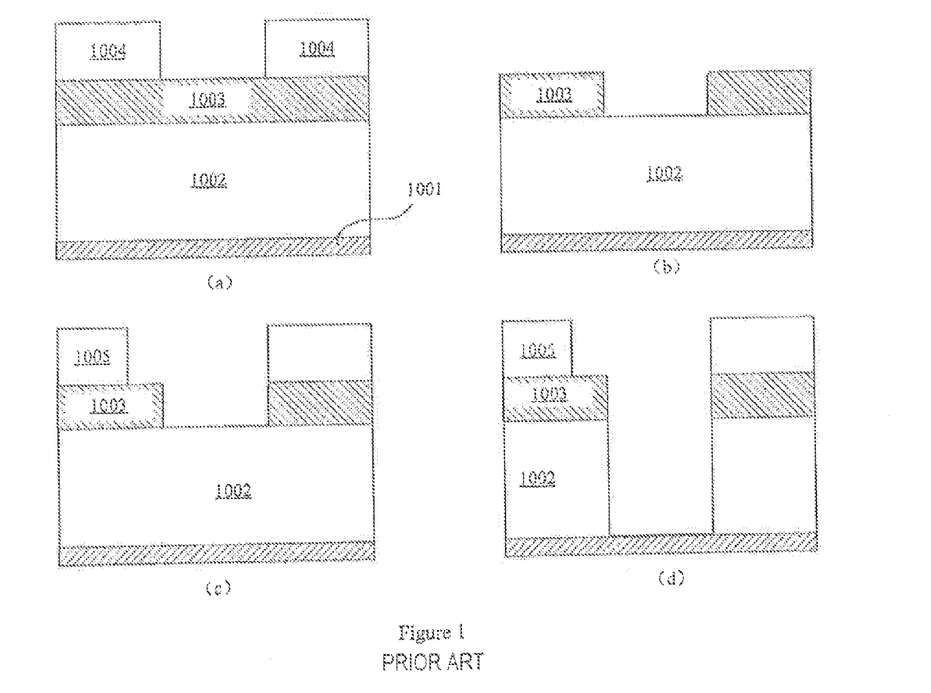
FIGS. 1(a)-1(d) are schematic views of the semiconductor structure manufactured by the conventional process.

A method of manufacturing a self-aligned via stack is disclosed in the present invention. The present invention is able to form the via and the metal lines at the same time. The simultaneously formed via and metal lines are referred as the via stack. This process and its problem will be described in detail in the following in conjunction with FIG. 1. FIGS. 1(a)-(d) illustrate a schematic view of manufacturing a self-aligned via stack. Such a self-aligned via stack primarily comprises an etching stop layer 1001, an interlayer dielectric (ILD) layer 1002 located on the etching stop layer, and a hard mask layer 1003 located on the ILD layer 1002. As shown in FIG. 1(a), a photoresist 1004 is applied and patterned so that the via is formed among the remaining photoresist 1004. Next, as shown in FIG. 1(b), the hard mask layer is etched to further form the via in the hard mask layer, and the remaining photoresist and the etched polymer are cleaned and removed. As shown in FIG. 1(c), after the patterning for the via is completed, a photoresist pattern 1005 is coated again on the hard mask layer to define the patterns of the metal lines to be formed. By employing the hard mask 1003 on the ILD layer 1002 and the photoresist pattern 1005 as the mask, it is further etched into the ILD layer 1002. The via formed by etching is shown in FIG. 1(d), and the width of the upper portion of the via is greater than that of the lower portion. Finally, a conductive plug is formed in the formed via. The upper potion of the conductive plug is wider and is used as the metal lines, and the lower portion of the conductive plug is narrower and is used as a conductive plug in the silicon via and commonly is electrically connected to the interconnect structure on the semiconductor structure. Thus, the via stack structure is formed by the self-alignment technique.

However, because the size of the via may not be altered arbitrarily, there is still a problem of shorts for the self-aligned via stack structure as shown in FIG. 1.

SUMMARY OF THE INVENTION

In view of the above defects of the conventional process, the present invention provides a semiconductor structure having a self-aligned via stack structure with viable sizes.

According to the first aspect of the present invention, it provides a semiconductor structure comprising a semiconductor substrate, a local interconnect structure connected to the semiconductor substrate, at least one via stack structure electrically connected to the local interconnect structure, in which the at lease one via stack structure comprises a via comprising an upper via and a lower via, the width of the upper via being greater than that of the lower via; a via spacer formed closely adjacent to the inner walls of the lower via; an insulation layer covering the surfaces of the via and the via spacer; and a conductive plug formed within the space surrounded by the insulation layer and electrically connected to the local interconnect structure.

Preferably, the thickness of the via spacer may be 5-100 nm and the width at the bottom of the via may be 30-500 nm.

Optionally, the via spacer is formed closely adjacent to the inner walls at the bottom of the via and also may be formed in the middle part of the lower via.

Downwards from the via spacer, the width of the conductive plug is aligned with the inner walls of the via spacer. Therefore, the width of the conductive plug may be defined by pitches between the inner walls of the via spacer.

Optionally, the via spacer may be formed a material selected from at lease one of $SiO_2$, $Si_3N_4$, SiON, SiOF, SiCOH, SiO, SiCO, and SiCON.

The conductive plug further comprises a blocking layer and a conductive material, the blocking layer covers the surface of the insulation layer, and the conductive material is formed within the space surrounded by the blocking layer. The blocking layer may be formed of one of TiN, TaN, Ta, Ti, TiSiN, TaSiN, TiW, WN and Ru or any combination thereof. The conductive material may be formed of any one of W, Al, Cu and TiAl.

The via in the embodiment of the present invention is formed by self-alignment.

According to the other aspect of the present invention, it provides a method of manufacturing a semiconductor structure, which comprises: providing a semiconductor substrate with a local interconnect structure formed thereon; forming a lower via and a via spacer; forming an upper via; covering the via and the via spacer to form an insulation layer; forming a conductive plug within the space surrounded by the insulation layer, in which the upper via and the lower via form the via, and the conductive plug is electrically connected to the local interconnect structure.

Optionally, the step of forming a lower via and a via spacer may comprise forming a dielectric layer on the local interconnect structure; defining, on the dielectric layer, the width of the upper via to be formed by a first mask pattern; defining the width of the lower via to be formed by a second mask pattern; etching downwards the dielectric layer to the local interconnect structure with the second mask pattern as a mask, thereby forming the lower via connected to the local interconnect structure by self-alignment; and forming a via spacer along the inner walls at the bottom of the lower via.

Optionally, the step of forming a lower via and a via spacer may comprise forming a dielectric layer on the local interconnect structure; defining, on the dielectric layer, the width of the upper via to be formed by a first mask pattern; defining the width of the lower via to be formed by a second mask pattern; etching downwards the dielectric layer with the second mask patter as a mask thereby forming a part of the lower via; forming a via spacer along the inner walls at the bottom of the part of the lower via; and further etching the dielectric layer to the local interconnect structure with the via spacer as a mask, thereby completing the formation of the lower via.

Preferably, the step of forming the upper via comprises removing the second mask pattern and etching downwards the dielectric layer with the first mask pattern as a mask to form the upper via by self-alignment, in which the upper via is communicated with the lower via.

Preferably, the step of forming the conductive plug may comprise covering the surface of the insulation layer to form a blocking layer and forming a conductive plug within the space surrounded by the blocking layer.

The semiconductor structure and method of manufacturing the same in accordance with the embodiments of the present invention may achieve a self-aligned via stack and may arbitrarily adjust via sizes to avoid the via-to-via shorts and to increase the yield rate.

BRIEF DESCRIPTION OF THE DRAWINGS

The above objects, advantages and features of the present invention will be apparent from the following detailed description of the preferred embodiments of the present invention taken conjunction with the drawings, in which:

FIGS. 2~12 are schematic views of the respective steps of the method for manufacturing the semiconductor structure provided by the first embodiment of the present invention, in which FIGS. 13~18 are schematic views of the respective steps of the method for manufacturing the semiconductor structure provided by the second embodiment of the present invention, in which

It should be noted that the accompanying drawings in this specification are not drawn to scale and are only for illustrative purpose, and should not be understood as any limitation and restriction to the scope of the present invention. In the accompanying drawing, like components are indicated by like reference numbers.

DETAILED DESCRIPTION OF PREFERRED EMBODIMENTS

Now, the preferred embodiments of the present invention will be illustrated by referring to the drawings. During description, unnecessary details and functions for the present invention are omitted to avoid confusion for the understanding of the present invention.

Figure 11:
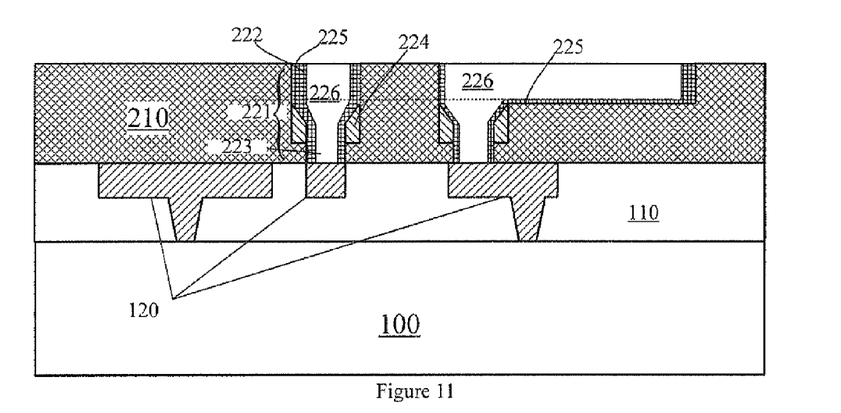
FIG. 11 and FIG. 12 illustrate the semiconductor structure completed by the method of manufacturing a semiconductor structure provided by the first embodiment of the present invention.

First of all, the semiconductor structure manufactured through the process provided by the first embodiment of the present invention will be described in detail by referring to FIGS. 11~12. FIG. 11 illustrates the schematic view of the semiconductor structure completed through the method of manufacturing a semiconductor structure provided by the first embodiment of the present invention.

As shown in FIG. 11, the semiconductor structure manufactured through the process provided by the present invention primarily comprises a semiconductor substrate 100, a first dielectric layer 110 formed on the semiconductor substrate 100, a second dielectric layer 210 formed on the first dielectric layer 110, in which a local interconnect structure 120 is further formed in the first dielectric layer 110. In the second dielectric layer 210, a via stack structure 220 is formed to be electrically connected to the local interconnect structure 120.

The via stack structure 220 comprises: a via 221 having an upper via 222 and a lower via 223, the width of the upper via 222 being greater than that of the lower via 223 (in the figure, the upper via 222 and the lower via 223 are separated by dashed lines); a via spacer 224 formed closely adjacent to the inner walls of the lower via 223; an insulation layer 225 covering the surfaces of the via 221 and of the via spacer 224; a conductive plug 226 formed within the space surrounded by the insulation layer 225 and being electrically connected to the local interconnect structure 120.

Preferably, the thickness of the via spacer 224 may be 5-100 nm, and the width at the bottom of the via 221 may be 30-500 nm.

Figure 16:
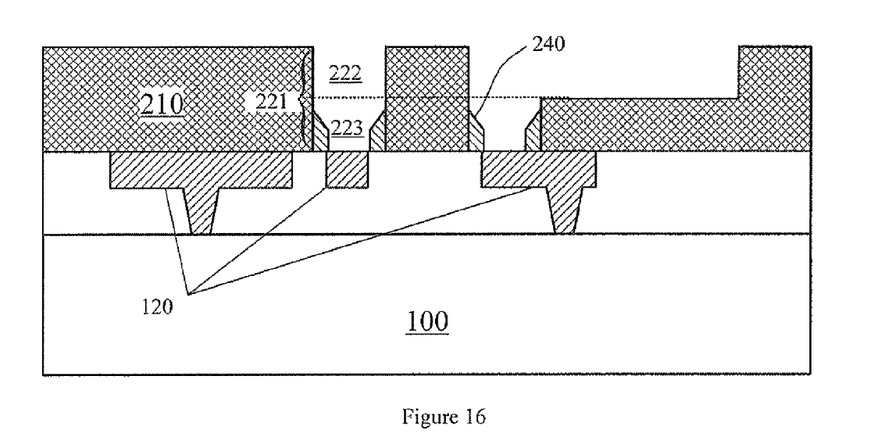
Figure 17:
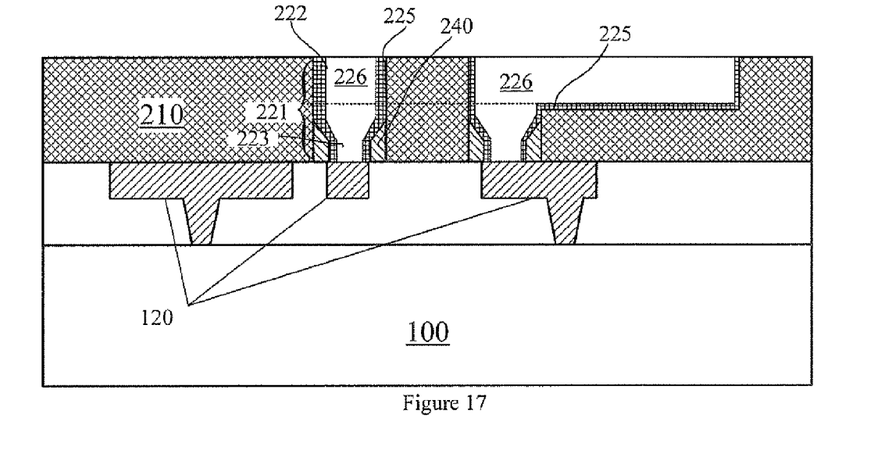
FIG. 17 and FIG. 18 illustrate the semiconductor structure completed by the method of manufacturing a semiconductor structure provided by the second embodiment of the present invention.
Figure 18:
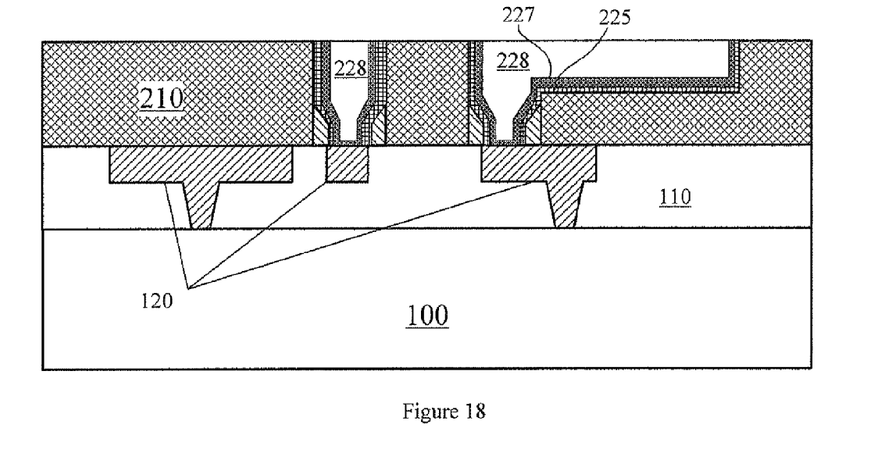

Optionally, the via spacer 224 is formed closely adjacent to the middle part of the lower via 223, and may be formed on the inner walls at the bottom of the via 221, as shown in FIGS. 16-18.

Downwards from the via spacer 224, the width of the conductive plug 226 is equal to the width at the inner walls of the via spacer 224. Therefore, the width of the conductive plug 226 may be defined by pitches between the inner walls of the via spacer 224.

Optionally, the via spacer 224 may be formed of a material selected from at lease one of $SiO_2$, $Si_3N_4$, SiON, SiOF, SiCOH, SiO, SiCO and SiCON.

Figure 12:
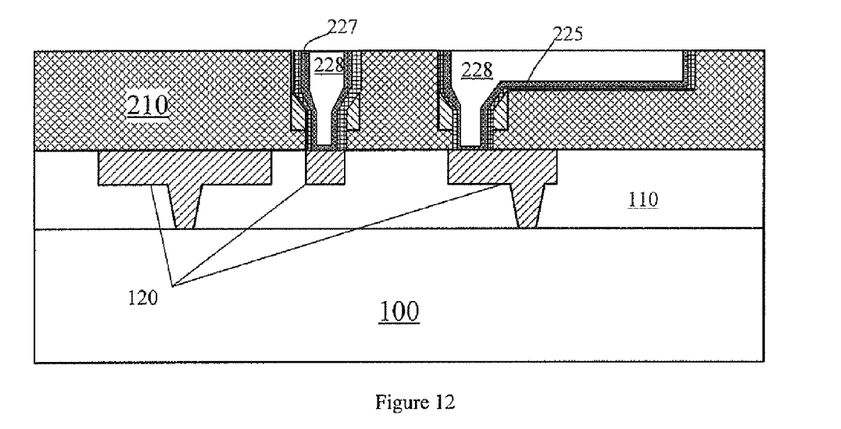

By referring to FIG. 12, the conductive plug 226 further comprises a blocking layer 227 and a conductive material 228. The blocking layer covers the surface of the insulation layer 225, and the conductive material 228 is formed within the space surrounded by the blocking layer 227. The blocking layer 227 may be formed of one of TiN, TaN, Ta, Ti, TiSiN, TaSiN, TiW, WN and Ru, or any combination thereof. The conductive material 228 may be formed of any one of W, Al, Cu, and TiAl.

The via of the embodiment of the present invention is formed by self-alignment.

In FIGS. 11 and 12, the via stack at the left side has a similar shape with that of the via stack at the right side along the direction perpendicular to the paper surface, and the width of the upper via is greater than that of the lower via, and the upper via functions as the metal line. The cases for the subsequent FIGS. 17 and 18 are similar to those of FIGS. 11 and 12.

As can be seen from the semiconductor structure shown in FIGS. 11 and 12, in said semiconductor structure, the via size may be adjusted through the thickness of the spacer, which achieves the purpose of the embodiment of the present invention, i.e. implementing the semiconductor structure having a via stack with variable via sizes.

FIGS. 17 and 18 illustrate the semiconductor structure achieved by another embodiment of the present invention.

In the following, the respective steps of the method for manufacturing a semiconductor structure in accordance with the second embodiment of the present invention will be described with reference to FIGS. 2-12.

Figure 2:
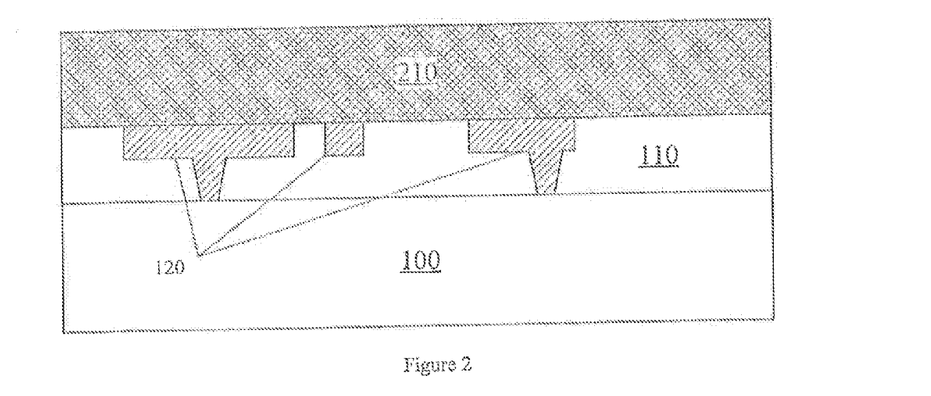

First of all, as shown in FIG. 2, a local interconnect structure 120 is formed on the semiconductor substrate 100 having an IC device (not shown). For example, the local interconnect structure 120 may be formed by the damascene process. First, an interlayer dielectric layer 110 having a thickness of about 100-300 nm is deposited on the semiconductor substrate 100 after completing the device manufacturing. The material such as un-doped silicon oxide ($SiO_2$), various doped silicon oxide (such as boron-silicon glass, boron-phosphor-silicon glass and so on) and silicon nitride ($Si_3N_4$) may be used as the material for consisting the interlayer dielectric layer 110. Next, chemical mechanism polishing, patterning, etching and metals of tungsten (W) depositing are performed, finally followed by metal layer polishing, photolithography, development, etching, cleaning and Cu-plating. The local interconnect structure 120 may be composed of copper or other conductive materials.

Then, an interlayer dielectric layer 210 having a thickness of about 100-500 nm may be formed on the semiconductor substrate with the local interconnect structure 120 formed thereon.

Figure 3:
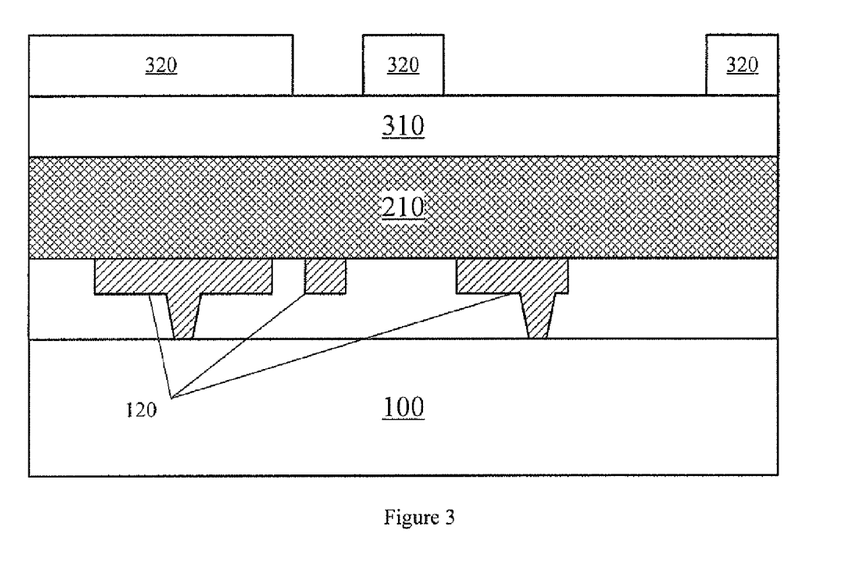

Next, as shown in FIG. 3, a polycrystalline silicon layer 310 is deposited on the semiconductor structure shown in FIG. 2, as the hard mask for the next level interconnect. Then, a photoresist PR 320 is coated on the polycrystalline silicon layer 310, and is patterned for the next level interconnect. Those skilled in the art may select other materials than the polycrystalline silicon as the hard mask, as appropriate.

Figure 4:
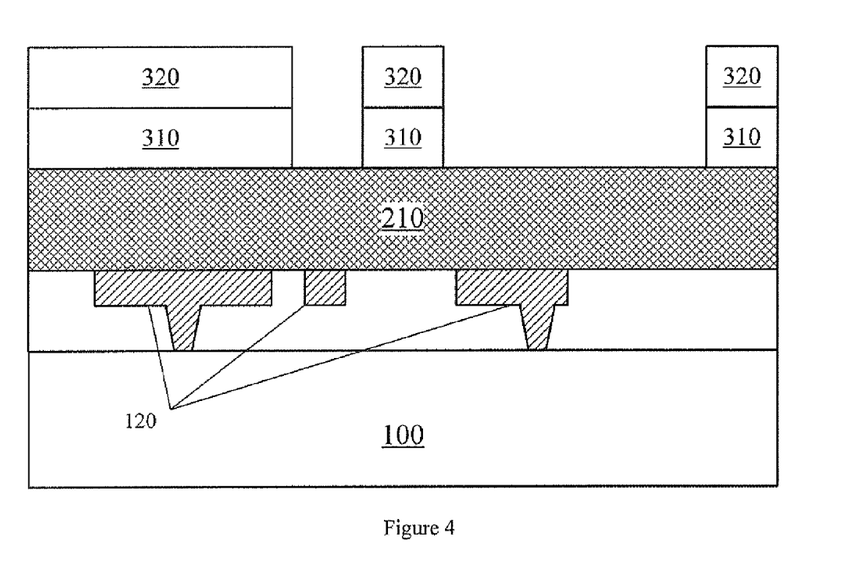

As shown in FIG. 4, the polycrystalline silicon layer 310 is etched by a dry etching process with the patterned photoresist in FIG. 3 as the mask, so as to form the hard mask for the next level interconnect. The dry etching process may be reactive ion etching (RIE). The pattern of the etched polycrystalline silicon layer 310 is referred as the first mask pattern for defining the width of the upper via. Then, the photoresist PR 320 on the patterned polycrystalline silicon 310 as the hard mask is removed.

Figure 5:
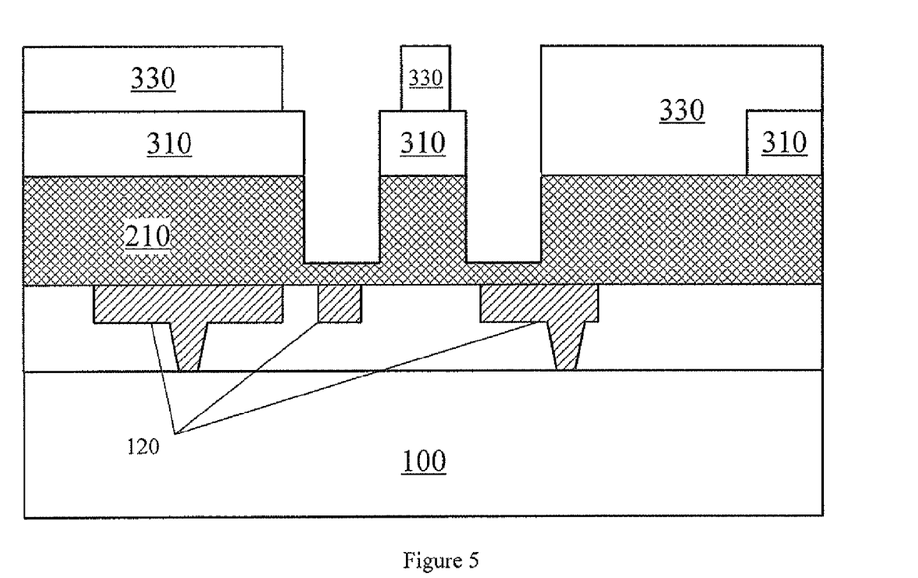
Figure 6:
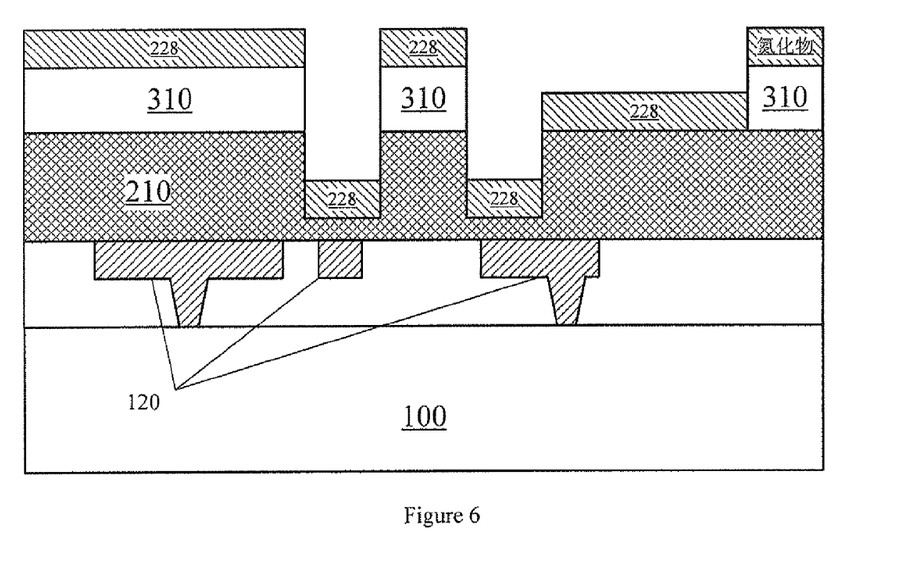

As shown in FIG. 5, a new photoresist is coated on the polycrystalline silicon layer 310 as the hard mask. The photoresist is exposed, developed and removed, so as s to form a patterned photoresist PR 330, as the photoresist mask for the self-aligned via stack. The pattern of the photoresist PR 330 formed after being patterned is referenced as the second mask pattern and is used to define the width of the lower via. Then, RIE having selectivity to the polycrystalline silicon is used to etch the interlayer dielectric layer 210 to the half depth or to other depth. For example, the to etching depth may depend on the requirements for the process of the metal plug of the via . Then, as shown in FIG. 6, the photoresist PR 330 shown in FIG. 5 is removed. Then, the material 228 for the spacer having a thickness of 5-50 nm is deposited to form the via spacer. The material for the spacer 228 may be selected from at lease one of $SiO_2$, $Si_3N_4$, SiON, SiOF, SiCOH, SiO, SiCO, SiCON, or other materials.

It is appreciated that it is not necessary for the deposited material of the via spacer to be filled up in the via, as long as it satisfies the desired thickness required for forming the via spacer.

Figure 7:
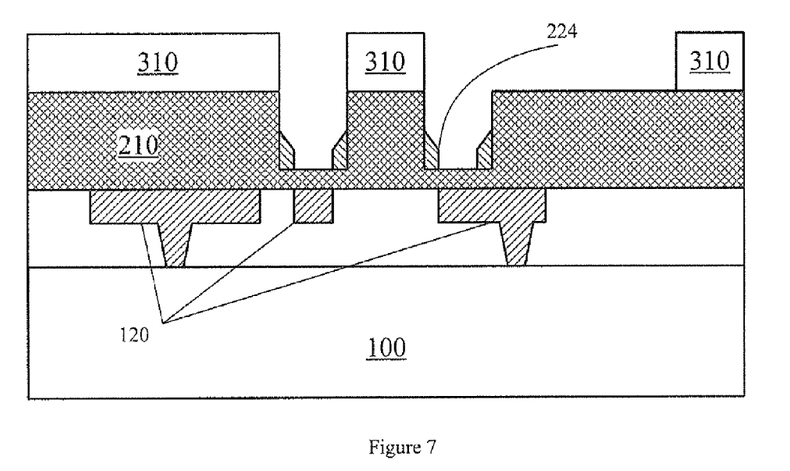

As shown in FIG. 7, the material 228 for the spacer in the process of FIG. 6 is etched by RIE (the mask step for RIE etching). The via spacer 224 as shown in FIG. 7 is formed on the sidewalls of the interlayer dielectric layer 210.

Figure 8:
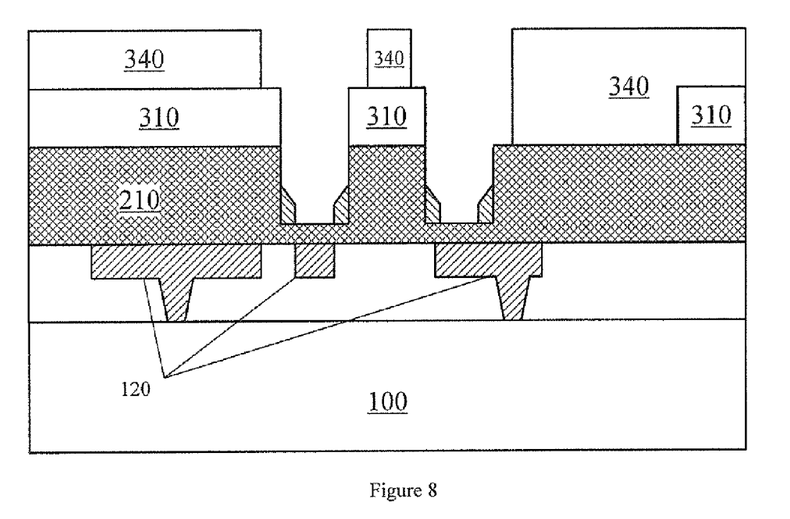
Figure 9:
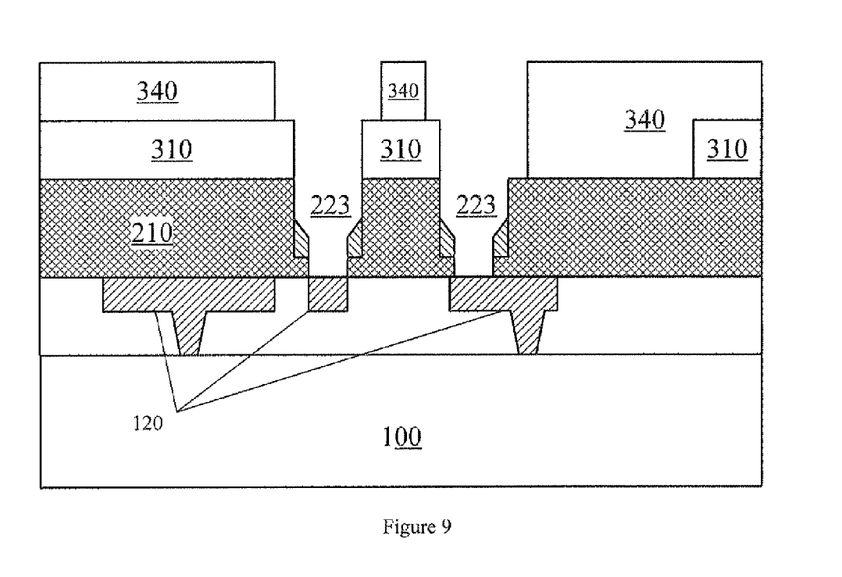

As shown in FIG. 8, a photoresist PR 340 is further formed on the structure obtained through the process in FIG. 7 for via etching. The interlayer dielectric layer 210 is further etched by RIE to the position of the interconnect 120 with the photoresist PR 340 and the via spacer 224 as the mask, so as to expose the upper surface of the interconnect 120 and obtain the structure shown in FIG. 9. Finally, the lower via 223 is formed.

Figure 10:
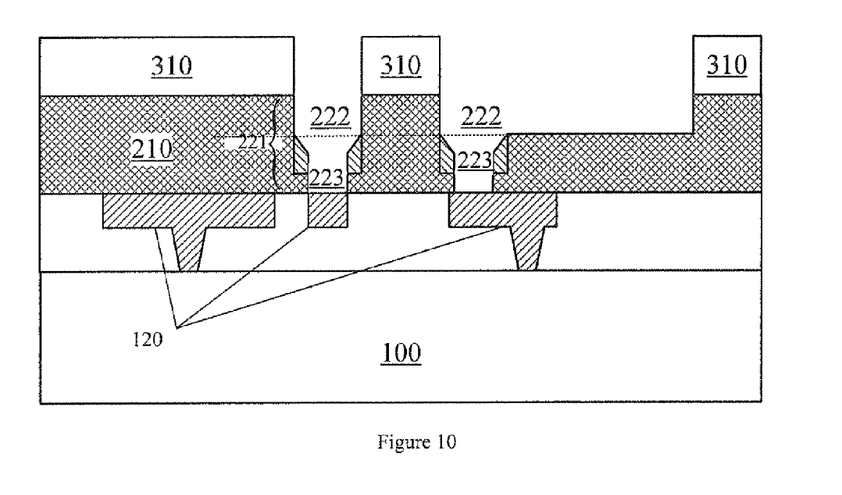

As shown in FIG. 10, the photoresist PR 340 is removed, and the interlayer dielectric layer 210 is further etched by RIE with the polycrystalline silicon 310 (the first mask pattern) as the mask, so as to obtain the upper via 222 shown in FIG. 10. The upper via 222 and the lower via 223 together form the via 221.

As can be seen, through the via spacer technique, various via sizes are implement while the via self-alignment is maintained.

Finally, the via stack as shown in FIG. 11 is formed by the conventional method. For example, the insulation layer 225 is formed, and the conductive plug 226 is formed within the space surrounded by the insulation layer 225. As shown in FIG. 12, the conductive plug may further comprise a blocking layer 227, and a conductive material 228 formed within the space surrounded by the blocking layer 227. The CMP process is performed and stops at the interlayer dielectric layer 210. The polycrystalline silicon hard mask 310 is also removed by the CMP process. Thus, the semiconductor structure in accordance with the first embodiment of the present invention is obtained.

In the following, the respective steps of the method for manufacturing the semiconductor structure in accordance with the second embodiment of the present invention will be described in detail in conjunction with FIGS. 2~4 and FIGS. 13~18. For simplicity, the same processing steps in the second embodiment of present invention as that of the first embodiment are omitted, and the corresponding drawings for the first embodiment may be referred when the particular steps are illustrated.

First, the similar processing steps to the first embodiment of the present invention as shown in FIGS. 2-4 are performed. That is to say, a local interconnect structure 120 is formed on the semiconductor substrate 100 having an IC device (not shown). An interlayer dielectric layer 210 is deposited on the local interconnect structure 120. A polycrystalline silicon layer 310 is deposited as the hard mask for the next level interconnects. Then, a photoresist PR 320 is coated on the polycrystalline silicon layer 310, and is patterned for the next level interconnect. The polycrystalline silicon layer 310 is etched by a dry etching process with the patterned photoresist as a mask, so as to form a hard mask for the next level interconnect. Then the photoresist PR 320 as the hard mask on the patterned polycrystalline silicon 310 is removed. The width of the upper via is defined by the patterned photoresist 310 as the first mask pattern.

Figure 13:
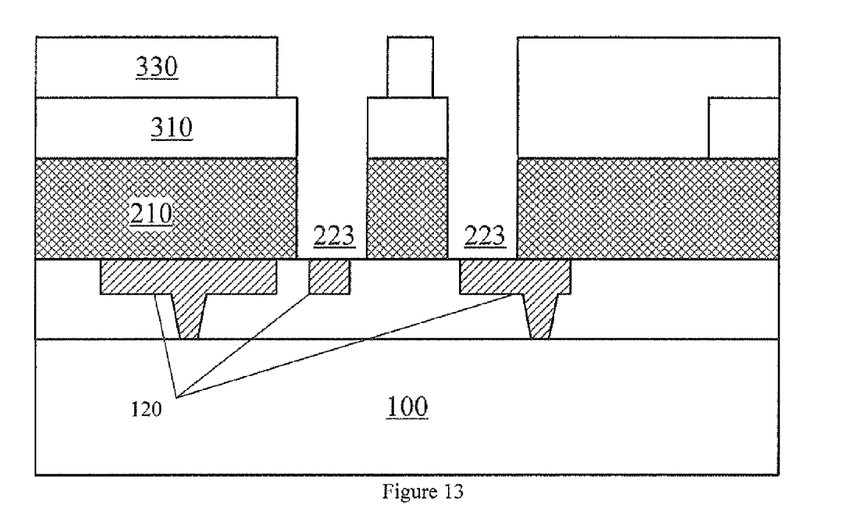

Next, as shown in FIG. 13, a further photoresist layer PR 330 of the self-aligned via is patterned. The photoresist 330 is referred as the second mask pattern to define the width of the lower via. Then, the interlayer dielectric layer 210 is etched with the second mask pattern by RIE to the local interconnect structure 120 to be connected, so as to expose the upper surface of the local interconnect structure 120 to be connected, and finally the lower via 223 is formed.

Figure 14:
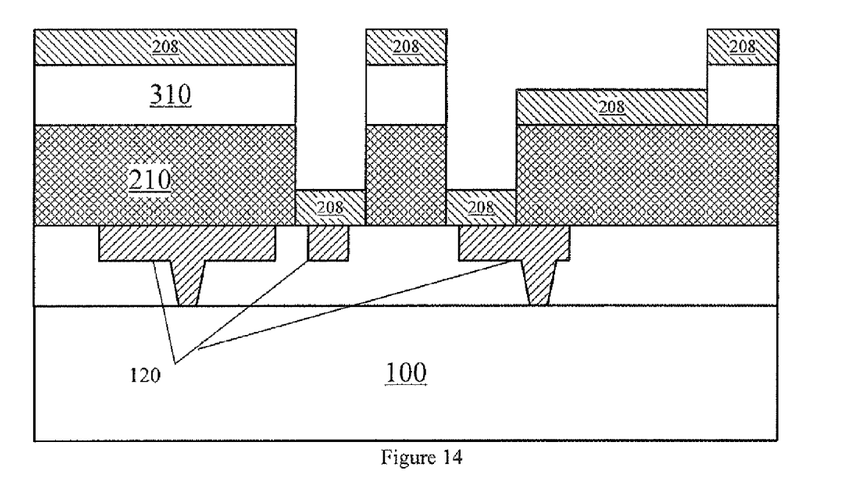

Then as shown in FIG. 14, the photoresist layer PR 330 is removed, and the spacer material, such as nitride or low-k materials, is deposited (for example, to a thickness of 5-50 nm). It should be noted that the deposited spacer material is not filled up in the via, but is filled in a portion of the via. Then, the spacer material is etched by RIE to form the via spacer 204 on the sidewalls of the interlayer dielectric layer 210 rather than on the hard mask, so as to achieve the structure shown in FIG. 15. The upper surface of the local interconnect structure 120 to be connected is exposed by etching the spacer material 208 by RIE.

Figure 15:
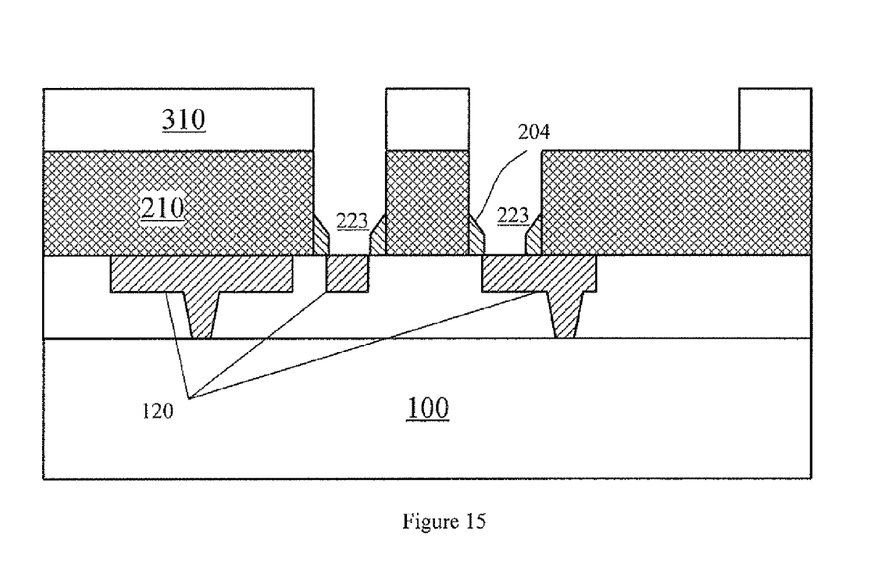

Is Next, as shown in FIG. 15, the interlayer dielectric layer 210 is etched by RIE with the polycrystalline silicon layer 310 (the first mask pattern) as the hard mask to obtain the upper via 222, so as to form the structure as shown in FIG. 16. The upper via 222 and the lower via 223 form the via 221.

On the basis of the structure as shown in FIG. 16, the structure as shown in FIG. 17 is formed by the conventional method. For example, an insulation layer 225 is formed, a conductive plug 226 is formed, and CPM is performed and stops at the interlayer dielectric layer 210. While the CMP is implemented, the polycrystalline silicon layer 310 is removed together. Thus, the semiconductor structure in accordance with the second embodiment of the present invention is obtained.

As shown in FIG. 18, the conductive plug 226 may further comprise a blocking layer 227 and a conductive material 228.

The problem with the process for the self-aligned via in the prior art is that the via is too large, and it is very likely to form shorts with the local interconnect structure. The self-aligned via stack structure in accordance with the embodiment of the present invention avoids the defects in the prior art, and may achieve a via stack with variable via sizes.

Thus, the present invention is illustrated in conjunction with the preferred embodiment. It is appreciated that various alternations, substitutions and additions may be made by those skilled in the art without departing from the spirit and scope of the present invention. Therefore, the scope of the present invention is not limited to the specific embodiment mentioned above, and is defined by the accompanying claims.

What is claimed is:

1. A semiconductor structure with variable via sizes, comprising:
   a semiconductor substrate,
   a local interconnect structure connected to the semiconductor substrate, and
   at least one self-aligned via stack structure electrically connected to the local interconnect structure,
   wherein the at least one self-aligned via stack structure comprises:
      a plurality of vias each comprising an upper via and a lower via, the width of the upper via being greater than that of the lower via and the upper via being self-aligned with the lower via;
      a via spacer formed closely adjacent to inner walls of the lower via, the size of the vias being adjusted through the thickness of the via spacer;
      an insulation layer covering surfaces of the via and the via spacer; and
      a conductive plug formed within a space surrounded by the insulation layer, and electrically connected to the local interconnect structure.

2. The semiconductor structure of claim 1, wherein the thickness of the via spacer is 5-100 nm.

3. The semiconductor structure of claim 1, wherein the width at the bottom of the via is 30-500 nm.

4. The semiconductor structure of claim 1, wherein the via spacer is formed closely adjacent to the inner walls at a bottom of the lower via of the self-aligned via stack structure.

5. The semiconductor structure of claim 1, wherein downwards from the via spacer, the width of the conductive plug is equal to the width at inner walls of the via spacer.

6. The semiconductor structure of claim 1, wherein the via spacer is formed of a material selected from at least one of $SiO_2$, $Si_3N_4$, SiON, SiOF, SiCOH, SiO, SiCO, and SiCON.

7. The semiconductor structure of claim 1, wherein the conductive plug further comprises a blocking layer and a conductive material, the blocking layer covers a surface of the insulation layer, and the conductive material is formed within a space surrounded by the blocking layer.

8. The semiconductor structure of claim 7, wherein the blocking layer is formed of one of TiN, TaN, Ta, Ti, TiSiN, TaSiN, TiW, WN and Ru or any combination thereof.

9. The semiconductor structure of claim 7, wherein the conductive material is formed of any one of W, Al, Cu and TiAl.

10. A method of manufacturing a semiconductor structure, comprising:
    providing a semiconductor substrate with a local interconnect structure formed thereon;
    forming a lower via and a via spacer closely adjacent to inner walls of the lower via, a size of the lower via being adjusted through the thickness of the via spacer;
    forming an upper via;
    forming an insulation layer to cover the lower via, the upper via and the via spacer; and
    forming a conductive plug within a space surrounded by the insulation layer,
    wherein the upper via and the lower via form a via, and the lower via and the upper via are formed by self-alignment and the conductive plug is electrically connected to the local interconnect structure.

11. The method of claim 10, wherein the step of forming the conductive plug comprises:
    covering a surface of the insulation layer to form a blocking layer; and
    forming a conductive material within a space surrounded by the blocking layer.

12. The method of claim 10, wherein the step of forming a lower via, via spacer and an upper via comprises:
    forming a dielectric layer on the local interconnect structure;
    defining, on the dielectric layer, the width of the upper via to be formed by a first mask pattern;
    defining the width of the lower via to be formed by a second mask pattern;
    etching downwards the dielectric layer to the local interconnect structure with the second mask pattern as a mask, thereby forming the lower via connected to the local interconnect structure by self-alignment; and
    forming a via spacer along inner walls at a bottom of the lower via.

13. The method of claim 12, wherein the step of forming the upper via comprises:
    removing the second mask pattern; and
    etching downwards the dielectric layer with the first mask pattern as a mask to form the upper via by self-alignment, wherein the upper via is communicated with the lower via.

14. The method of claim 12, wherein the step of forming the conductive plug comprises:
    covering a surface of the insulation layer to form a blocking layer; and
    forming a conductive material within a space surrounded by the blocking layer.

15. The method of claim 10, wherein the step of forming the lower via, the via spacer and an upper via comprises:
    forming a dielectric layer on the local interconnect structure;
    defining, on the dielectric layer, the width of the upper via to be formed by a first mask pattern;
    defining the width of the lower via to be formed by a second mask pattern;
    etching downwards the dielectric layer with the second mask pattern as a mask, thereby forming a part of the lower via by self-alignment;
    forming a via spacer along inner walls at a bottom of the upper via and at a top of the lower via; and
    further etching the dielectric layer to the local interconnect structure with the via spacer as a mask, thereby completing the formation of the lower via.

16. The method of claim 15, wherein the step of forming the upper via comprises:
    removing the second mask pattern; and etching downwards the dielectric layer with the first mask pattern as a mask to form the upper via by self-alignment, wherein the upper via is communicated with the lower via.

17. The method of claim 15, wherein the step of forming the conductive plug comprises:
covering a surface of the insulation layer to form a blocking layer; and
forming a conductive material within a space surrounded by the blocking layer.

* * * * *

UNITED STATES PATENT AND TRADEMARK OFFICE
CERTIFICATE OF CORRECTION

Page 1 of 1

PATENT NO. : 8,610,275 B2
APPLICATION NO. : 12/996721
DATED : December 17, 2013
INVENTOR(S) : Huilong Zhu, Haizhou Yin and Zhijiong Luo

It is certified that error appears in the above-identified patent and that said Letters Patent is hereby corrected as shown below:

In the Specification:

Col. 5, Line 28
  Delete "s" before "to form"

Col. 5, Line 35
  Delete "to" before "etching depth"

Signed and Sealed this
Fourth Day of March, 2014

Michelle K. Lee
*Deputy Director of the United States Patent and Trademark Office*